United States Patent [19]
Ishihara et al.

[11] Patent Number: 5,443,030
[45] Date of Patent: Aug. 22, 1995

[54] CRYSTALLIZING METHOD OF FERROELECTRIC FILM

[75] Inventors: Kazuya Ishihara, Tenri; Shigeo Onishi, Nara; Masaya Komai, Tenri, all of Japan

[73] Assignee: Sharp Kabushiki Kaisha, Osaka, Japan

[21] Appl. No.: 321,470

[22] Filed: Oct. 11, 1994

Related U.S. Application Data

[63] Continuation of Ser. No. 998,844, Dec. 30, 1992, abandoned.

[30] Foreign Application Priority Data

| Jan. 8, 1992 | [JP] | Japan | 4-001449 |
| Jan. 30, 1992 | [JP] | Japan | 4-014472 |
| Feb. 19, 1992 | [JP] | Japan | 4-031853 |
| Feb. 19, 1992 | [JP] | Japan | 4-031855 |

[51] Int. Cl.⁶ ............................................. C30B 1/06
[52] U.S. Cl. ............................................. 117/8; 117/7; 117/9; 117/10; 117/947
[58] Field of Search ................. 117/7, 8, 9, 10, 947, 117/944

[56] References Cited

U.S. PATENT DOCUMENTS

| 5,043,049 | 8/1991 | Takenaka | 204/192.15 |
| 5,119,154 | 6/1992 | Gnadinger | 357/51 |
| 5,155,658 | 10/1992 | Inam et al. | 361/321 |

FOREIGN PATENT DOCUMENTS

| 2-249278 | 3/1990 | Japan |
| 02240089 | 10/1990 | Japan |

OTHER PUBLICATIONS

Holman et al, "Intrisic Nonstoichiometry in the Lead Zirconate-Lead Titanate System...," J. Applied Physics, vol. 44, No. 12 Dec. 1973 pp. 5227-5236.

*Primary Examiner*—Robert Kunemund
*Attorney, Agent, or Firm*—Nixon & Vanderhye

[57] ABSTRACT

A lower capacitor electrode is formed on the basic plate 1, and thereafter a ferroelectric film, for example, a PZT film having the Pb is formed. ITO, $RuO_2$, $SnO_2$ which are Pt or oxide conductive material are formed as a cap layer into 200 Å or more in film thickness by a sputtering method or silicone oxide film or the like are formed with 200Å or more in film thickness by a thermal CVD method. Thereafter, a thermal operating operation is effected. By the prevention of the Pb from being evaporated at the thermal processing time, the elaborate ferroelectric film of stoichiometrical perovskite construction can be formed.

15 Claims, 4 Drawing Sheets

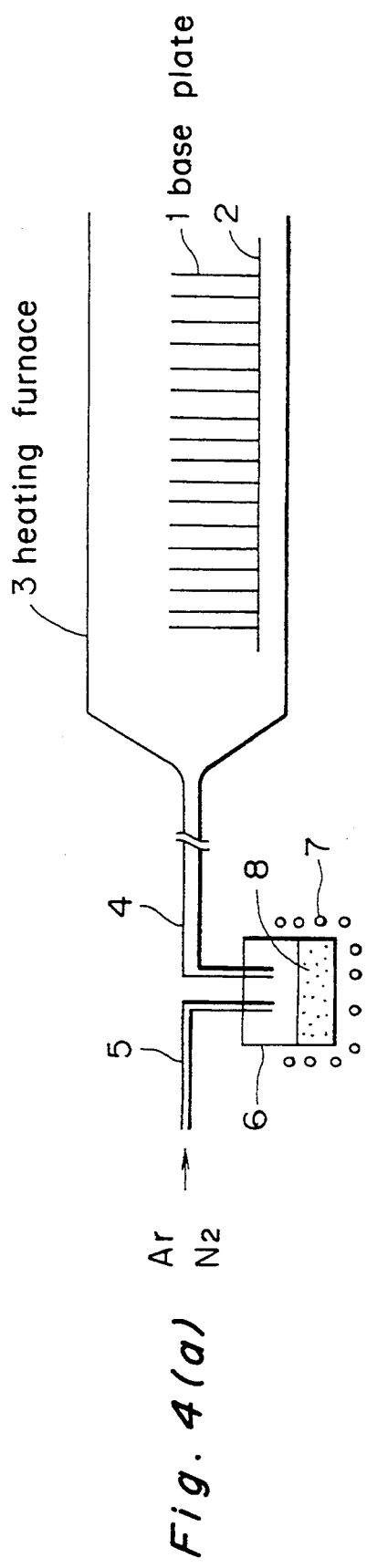
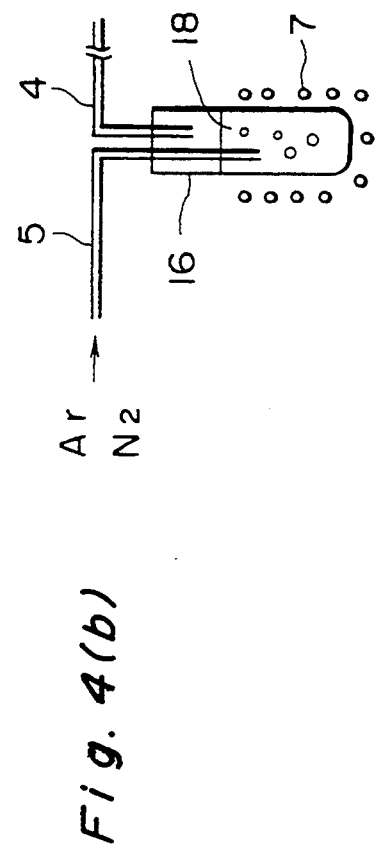
Fig. 4(a)
Fig. 4(b)

CRYSTALLIZING METHOD OF FERROELECTRIC FILM

This is a continuation of application Ser. No. 07/998,844, filed Dec. 30, 1992, now abandoned.

BACKGROUND OF THE INVENTION

I. Field of the Invention

The present invention generally relates to a crystallizing method of a ferroelectric film having Pb in a composition.

II. Related Art and Other Considerations

Since Pb in a film is likely to be drawn out in a crystallizing step in the ferroelectric film (including the Pb in accordance with the present invention), a cap layer is formed on the film surface. The Pb drawing out operation is restrained by a thermal processing operation so as to effect the crystallizing operation. The Pb drawing out operation in the film is further prevented effectively by the use of short hours' lamp heating in the thermal processing operation. Thus prepared, a delicate film can be realized with the crystal grain diameter being uniform. Typically, a halogen arc lamp having wide wavelengths from infrared rays to ultraviolet rays is used as a heating lamp. An oxygen gas used in the thermal processing atmosphere is cracked so as to cause atomic active oxygen for effectively preventing an oxygen deficiency in the film. The same effect can be obtained also with the use of the ozone gas. Also, a gas including Pb may be used in the crystallizing step.

A method is used of growing a film on a base plate at a temperature of approximately 200° through 300° C. by sputtering. A subsequent thermal processing operation at 600° through 700° C. changes the crystal construction of a PZT film or a PLZT film (which is a ferroelectric film material) to a perovskite type crystal construction.

Since the Pb in the PZT ($PbZr_xTi_{1-x}O_3$), PLZT (($Pb_{1-x}La_x$) ($Zr_{1-y}Ti_y$)$_{1-y/4}O_3$) film is higher at an evaporation pressure as compared with Zr, Ti, La, the evaporation of PbO into the thermal processing operation and the composition ratio of the Pb in the film (after the thermal processing operation) is reduced, so that (hereinafter referred to as "stoichiometrical") the perovskite type crystal construction having chemically stablest composition cannot be obtained.

A film including the Pb excessively in advance is formed and a ferroelectric film of stoichiometrical perovskite type crystal structure is obtained by the thermal processing.

PbO is required excessively by approximately 15 through 20 mol for stoichiometrical PZT or PLZT film for excessive Pb in the film in the use of the above described method. Pin holes are likely to be caused, thus making it difficult to form the delicate film, because the PbO is evaporated when the PZT or PLZT film having the PbO excessively like this is thermally processed.

PZT ($PbZr_xTi_{1-x}O_3$), PLZT (($Pb_{1-x}La_x$) ($Zr_yTi_{1-y}$)$_{1-x/4}O_3$) and so on are known as a ferroelectric film including the Pb in the composition. Films having a given composition including the Pb are accumulated on the base plate by the sputtering method or a sol gel method when this type of ferroelectric film is conventionally formed. Thereafter, the base plate is set in a vessel which in turn is put into an electric furnace where the thermal processing operation is effected in the temperatures of 550° through 650° C. for approximately a few hours in an inert gas. The accumulated films (noncrystalloid) are changed into the perovskite type crystal structure to have the ferroelectric property for forming a ferroelectric film.

As the conventional forming method effects the above described thermal processing operation with the use of the electric furnace, at least approximately thirty minutes' time is required to be taken so as to raise the temperatures of the above described base plate and vessel, and to keep them stable. The crystal nuclei 12 which exist in the accumulated film 11 are excessively grown as shown in FIG. 2 (b), with a problem that the crystal grains 13 become excessively large in the ferroelectric film 11' after the thermal processing operation. When the crystal grains 13 in the film have become excessively large, stresses cause cracks in the ferroelectric film 11' and the conductivity becomes too high to be applicable as the dielectric film of the semiconductor element.

The evaporation pressure of the Pb becomes the highest in the composition of the above described ferroelectric film. A lot of Pb components are evaporated in the PbO condition (in the drawing, the component after the accumulation and the component after the thermal processing are shown) from the film 11 into the above described long hours' thermal processing as shown in FIG. 3 (b). The excessive Pb components of 10 through 20 mol % have to be added in advance into the accumulated film 11, with a problem that pin holes are caused in the ferroelectric film 11' are caused by the evaporation of the above described PbO to damage the film quality.

SUMMARY OF THE INVENTION

Accordingly, the present invention substantially eliminates the above discussed drawbacks inherent in the prior art and provides an improved crystallizing method of a ferroelectric film.

Another important object of the present invention is to provide an improved crystallized method of a ferroelectric film comprising a step of forming a cap layer on the surface of a ferroelectric film including the stoichiometrical Pb to prevent the composition ratio of the Pb from being reduced.

Still another object of the present invention is to provide an improved crystallized method of a ferroelectric film, comprising steps capable of forming the ferroelectric film including the Pb in the composition in a condition having crystal grains of a proper size, and restraining the evaporation of the PbO in the thermal processing operation so that it is not necessary to add excessive Pb components in advance, and thereby reduce pin holes.

A further object of the present invention is to provide a crystallized method of a ferroelectric film having a step capable of forming a ferroelectric film including the Pb in the composition in a condition where the film quality is superior.

A still further object of the present invention is to provide a crystallized method of a ferroelectric film having a step of retaining a high dielectric constant, without oxygen empty holes, and without leakage currents being caused upon application of an electric field.

In accomplishing these and other objects, according to one preferred embodiment of the present invention, a crystallizing method by the thermal processing of the ferroelectric film having the Pb of the present invention comprises steps of forming a cap layer on the above described ferroelectric film surface before the thermal processing, thereafter effecting the above described thermal processing operation. The cap layer is a layer for preventing the Pb from being evaporated in the form of the PbO at the thermal processing step. Platinum (Pt), oxide conductors (ITO, $RuO_2$, $SnO_2$, $ReO_3$, $LaCoO_3$, $La_{1-x}Sr_xCoO_3$, $LaCaMnO_3$ and so on) or silicon film oxide and so are formed by a thermal CVD method. The PbO can be prevented from being evaporated during the thermal processing time by the use of the crystallizing method of the ferroelectric film including the Pb in the above described composition, whereby the ferroelectric film has the stoichiometrical perovskite type crystal structure.

A ferroelectric film forming method according to another embodiment of the present invention comprises the steps of accumulating (on a base plate) films having the given composition including the Pb, thereafter effecting the thermal processing at the given temperature, changing the above described accumulated film into the perovskite type crystal structure, forming the ferroelectric film, and wherein the above described thermal processing operation is effected by a lamp heating operation.

According to the lamp heating method, lights (a halogen lamp or the like) irradiate the film accumulated on the base plate quickly for about one minute. When the film is thus quickly heated, more crystal nuclei are formed in the film as compared with conventional practice. The crystal grains collide with one another as the nucleus is grown from seed. The growth is stopped with the grain diameter being small. Thus, the ferroelectric film is formed with the crystal grain of the proper size being provided. As the thermal processing operation is effected for short time, the Pb amount in the film is retained approximately constant before and after the thermal processing operation. Therefore, excessive Pb components are not necessary to be added in advance. Further the number of pin holes is reduced so as to improve the film quality.

A ferroelectric film forming method according to another embodiment of the present invention comprises the steps of accumulating (on a base plate) films having the given composition including the Pb, thereafter effecting the thermal processing in the given atmosphere, changing the above described accumulated film into the perovskite type crystal structure, forming the ferroelectric film, and wherein the Pb or PbO gas is included in the above-described atmosphere. As the Pb or the PbO gas is included in the thermal processing atmosphere, the PbO is prevented from evaporating from the film into the thermal processing operation. Accordingly, pin holes are reduced so as to improve the film quality of the formed ferroelectric film.

A ferroelectric film forming method according to another embodiment of the present invention comprises the steps of heating to a given temperature the ferroelectric film oxide capable of forming the crystals of the perovskite construction under an oxygen atomic atmosphere, compensating the crystal defects to effect the crystallizing operation.

The above described oxygen atomic atmosphere compensates the crystal defects of the ferroelectric film oxide to be generated by the heating to the given temperature. The oxygen atomic atmosphere is composed of a quantity corresponding to 10 through 50 Torr normally at 650° C.

The oxygen atomic atmosphere can be formed, for example, as follows. A first method is effected by the irradiation of the ultraviolet rays into ozone or oxygen gas atmosphere. The ozone or oxygen gas atmosphere is composed of ozone or oxygen gas equivalent in quantity to the pressure of 10 through 50 Torr normally at 650° C.

The ultraviolet rays are desirably 185 nm or lower in wavelength. When the ultraviolet rays are irradiated upon the ozone gas as shown in the following equation, the $O_{(1D)}$ is caused. When the ultraviolet rays are irradiated upon the oxygen gas, the $O_{(1D)}$ is caused.

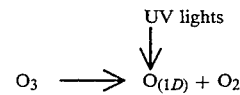

A second method is effected by the thermal cracking normally at 600° through 700° C. The ozone gas is used in quantity equivalent to the 10 through 50 Torr pressure normally at 650° C. The thermal cracking operation can convert the $O_3$ produced by the ozone generator into $O_{(3P)}$ as shown in the following equation.

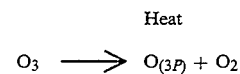

As the oxygen atom $O_{(1D)}$ is activated by 1 eV or higher than the $O_{(3P)}$, reaction is further promoted as compared with the $O_{(3P)}$.

Active oxygen atoms formed like this diffuse into the film interior and the grain field so as to bury the oxygen hollow holes so that the defective decrease can be realized.

In the first through the second methods, inert gases can be mixed properly.

The ferroelectric film oxygen capable of forming crystals of the above described perovskite structure is used to form the ferroelectric film oxygen made of crystals of the perovskite structure. Films of, for example, PZT, PLZT and so on are formed on the conductive base plate. The film normally has thickness of 0.2 through 0.5 μm.

The film can be formed by a sputtering method, a MOCVD method or the like.

The heating operation of the above described given temperature is effected to produce the crystals of the perovskite structure on the ferroelectric film oxide and normally is effected at 600° through 700° C.

A base plate with the ferroelectric film oxide having the crystals of the perovskite structure obtained being constructed has further a conductive film on it. The capacitor insulating film or the like of, for example, the semiconductor storing apparatus can be made.

The oxygen atoms are diffused into the crystal defect of the ferroelectric film oxide to be caused by the evaporation of the elements in the film, at the heating time for obtaining the crystals of the perovskite structure, to compensate the crystal defects.

It is noted that the vapor pressure of lead can be lowered by conducting the heat treatment after piling up the PZT film under the circumstances being pressurized to 2 to 3 atmospheric pressure. Also, if the heat treating is done under the circumstances of oxygen, an oxide substance PbO is provided with a vapor pressure lower than that of metal lead, so that the evaporation of lead can be suppressed.

With the employment of the above method, there provides a PZT film of good quality having nothing of pin-hole under the state of that the lead does not evaporate almost against the heat treatment of high temperature, as shown with a graph b of FIG. 1.

BRIEF DESCRIPTION OF THE DRAWINGS

These and other objects and features of the present invention will become apparent from the following description taken in conjunction with the preferred embodiment thereof with reference to the accompanying drawings, in which;

FIG. 4 (a), (b) are views for illustrating the ferroelectric film forming method in one embodiment of the present invention.

DETAILED DESCRIPTION OF THE INVENTION

Figure 1A:
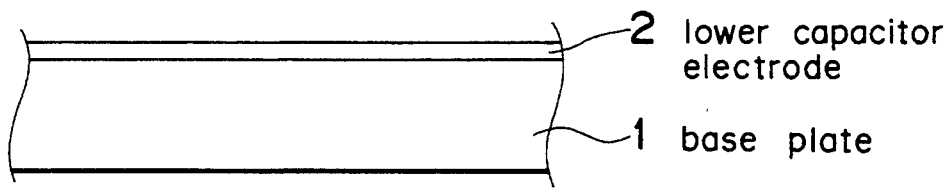
FIG. 1 (a), (b) and (c) show manufacturing step views in one embodiment of the present invention.

Before the description of the present invention proceeds, it is to be noted that like parts are designated by like reference numerals throughout the accompanying drawings.

Embodiment 1

Figure 1B:
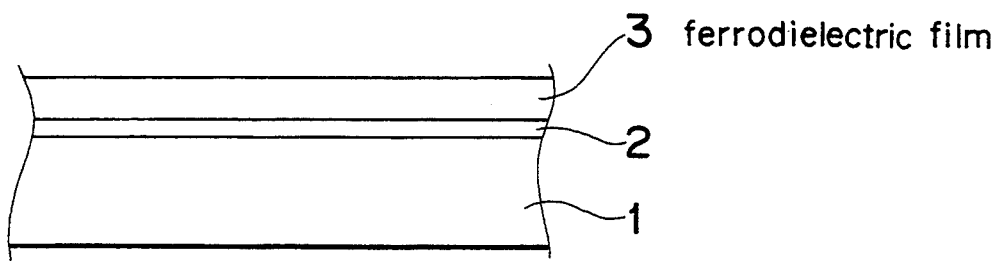
Figure 1C:
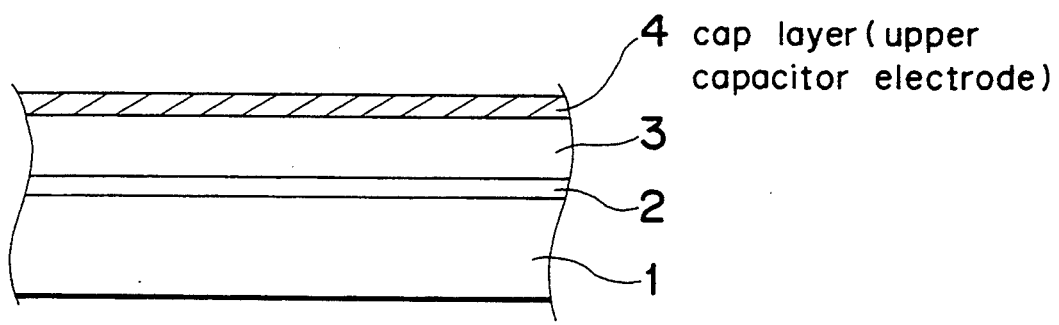

FIG. 1 shows a crystallizing step of the ferroelectric film in a first embodiment of the present invention. In particular, a capacitor forming step using a crystallizing method in accordance with the present invention will be described with the use of FIG. 1.

The Pt is accumulated (FIG. 1 (a)) with the use of a sputtering method or the like to form a lower capacitor electrode 2 on the base plate 1. Ferroelectric film materials having the Pb of PZT, PLZT or the like are accumulated (by a sputtering, A MOCVD method or the like) to form a ferroelectric film 3 of 0.2 through 0.5 $\mu$m thickness. (FIG. 1 (b)) At this point in time, the above described ferroelectric film 3 becomes a stoichiometrical, amorphous condition or pyrochlore structure.

ITO, $RuO_2$, $LaCoC_3$, $La_{1-x}Sr_xCoO_3$, $LaCaMnO_3$ or other materials which are Pt or film oxide conductive materials are accumulated by sputtering on the above described ferroelectric film to form a cap layer 4 (FIG. 1 (c)). Alternatively, the cap layer 4 is formed on the silicon oxide film and so on by a thermal CVD method (FIG. 1 (c)). The film thickness of the cap layer 4 must be 200 Å or more to prevent the evaporation of the PbO.

A thermal processing operation lasting approximately 0.5 through two hours is effected in an enert gas atmosphere with atmospheric pressure 600° through 700° C. so as to change the crystal structure of the ferroelectric film 3 from the amorphous condition or pyrochlore structure to the perovskite condition. The cap layer 4 is removed with HF solution or the like when the Pt or an oxide conductive material has been used as the cap layer 4, when the cap layer 4 has been used as an upper capacitor electrode, the insulating film of thermal film oxide or the like. Thereafter, a Pt film is formed (for example, by a sputtering method) as the upper capacitor electrode.

The present invention is applicable in the crystallizing step of the ferroelectric film having the Pb in composition without restriction to the above described embodiment. As the evaporation of the Pb can be prevented by the use of the present invention as described in detail, the elaborate ferroelectric film of stoichiometrical perovskite structure can be formed. C axis oriented PZT, PLZT films are obtained with the use of Pt film oriented (1, 1, 1) especially in the cap layer.

Embodiment 2

The ferroelectric film forming method of embodiment 2 uses PZT ($PbZr_xTi_{1-x}O_3$) film or PLZT (($Ob_{1-x}La_x$)($Zr_yTi_{1-y}$)$_{1-x}$/4$O_3$) as ferroelectric films.

(1) First, films having the above described composition are accumulated on a base plate 1 by a sputtering method or a sol gel method. The composition of the accumulated film is made in a stoichiometrical composition ratio or the Pb component is made excessive by several mol % in the Pb component.

(2) Then, as shown in FIG. 4 (a), the above described base plate (which is represented by reference numeral 1) is set in a vessel 2 and put into an electric furnace 3 to effect a thermal processing operation at temperatures 550° through 650° C. for about thirty minutes. Films (non-crystalloid) accumulated on the base plate 1 change to the perovskite type crystal structure for forming the ferroelectric film. At this time, a quartz (or stainless steel) container 6 with enclosed powdered $PbCl_2$, PBO, $Pb(C_{11}H_9O_2)_2$ or $Pb(OOCH_3)_2$ is connected to vessel 2 by a branch pipe 4 of the electric furnace 3. The container 6 is heated by a heater 7 to generate a PbO gas. The PbO gas, the inert gas (Ar, $N_2$ and so on) are fed through the piping 5 into electric furnace 3 as a carrier gas while the thermal processing operation is effected. The heating temperature of the container 6 is 400° to 500° C. when the contents of container 6 are $PbC_{12}$, PbO, 100° to 200° C. when the contents of container 6 are $Pb(C_{11}H_9O_2)_2$, $Pb(OOCH_3)_2$. As the PbO gas is included in the thermal processing atmosphere in the forming method, the PbO is prevented from being evaporated from the film during the thermal processing operation. Thus, pin holes can be reduced. The quality of the ferroelectric film thus produced is an improvement as compared with the conventional films.

As the quantity of PbO evaporated from within the film during the thermal processing operation is decreased, the amount of Pb component to be included in the film to be accumulated previously on the base plate 1 can be reduced in advance. Namely, as in step (1), the composition of the film to be accumulated will suffice if it is made as a stoichiometrical composition ratio or the Pb component is made excessive by several mol %. The excessive quantity may be made 1 several th as compared with the conventional one.

The evaporation of the PbO component from the film can be prevented even when the thermal processing operation has been effected in a condition where the Pb gas can be fed into the electric furnace 3 so that the film quality of the ferroelectric film to be formed can be improved. For example, as shown in FIG. 4 (b), liquid alkyl $Pb_{18}$ can be used at the atmospheric temperature. In this case, the Pb component is made volatile through bubbling with inert gases (Ar, $N_2$ and so on) with alkyl $Pb_{18}$ being enclosed in a stainless steel container 16.

As the ferroelectric film forming method of the present invention is thermally processed in the atmosphere including the Pb or the PbO gas, the evaporation of the PbO component can be prevented from the film. Accordingly, the film quality of the ferroelectric film can be improved.

Embodiment 3

A base plate with a PZT film of 0.3 μm in thickness by the sputtering method is disposed on the surfaces within the reaction chamber.

Ozone gas produced by a noiseless discharge type ozone generator is introduced in a quantity corresponding to the pressure of 50 Torr at 650° C. after the reaction chamber interior has been evacuated. The base plate is heated to 650° C. so as to effect the crystallizing processing operation of irradiating the bright lines of 254 or 185 nm with the use of a low pressure mercury lamp.

The crystallized PZT film had a dielectric constant of 2,000 through 3,000.

Embodiment 4

Embodiment 4 differs from embodiment 1 in that a PZT film is formed by a MOCVD method instead of a sputtering method, and an oxygen gas of 20 Torr is used instead of the use of ozone gas of 50 Torr. In other respects, a crystallizing processing operation of a PZT film is effected in the same manner as in the embodiment 1.

Embodiment 5

In embodiment 5, the crystallizing processing operation is effected as in the embodiment 1 in the other without the use of a low-tension mercury lamp.

As is clear from the foregoing description, the present invention provides a crystallizing method for a ferroelectric film oxide capable of retaining a high dielectric constant without leakage current (upon application of an electric field), and without oxygen hollow holes.

Figure 2A:
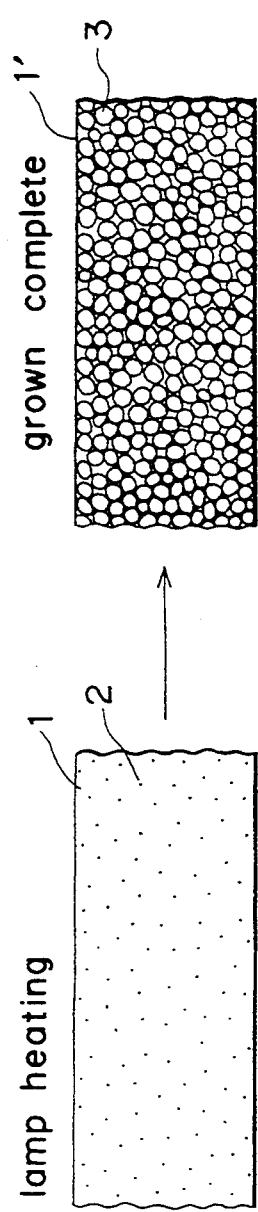
FIG. 2 (a), (b) show a method for illustrating the ferroelectric film forming method in one embodiment of the present invention, and a view for illustrating the conventional ferroelectric film forming method.
Figure 2B:
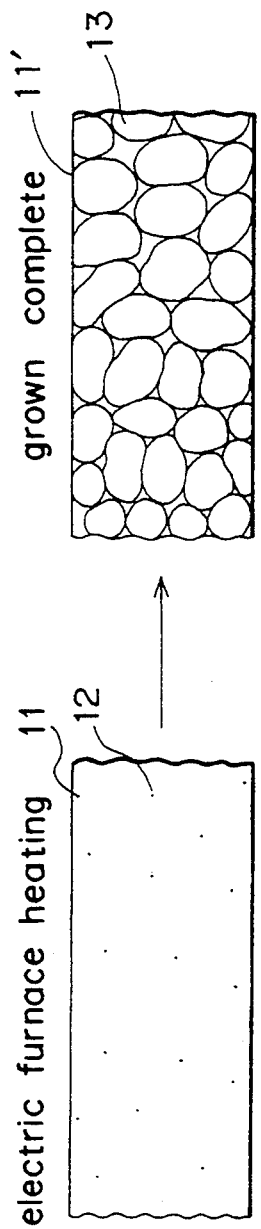

FIG. 2 illustrates a method for manufacturing a capacitor of ferroelectric substance. However, the present invention is not restricted to the embodiment of FIG. 2.

Figure 3B:
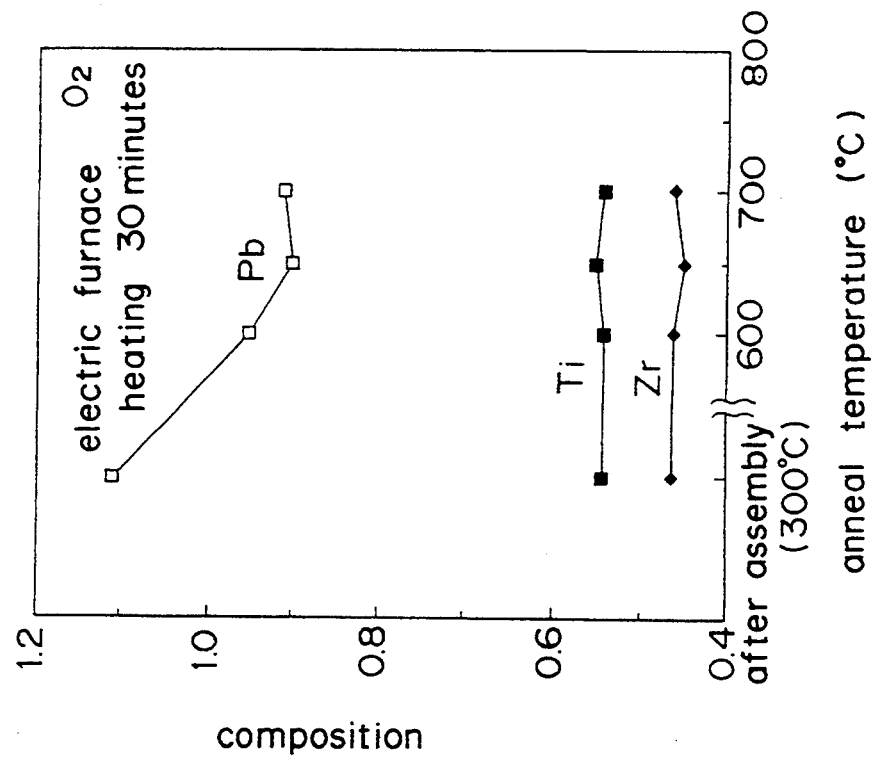
FIG. 3 (a), (b) are charts showing the composition of the ferroelectric film formed by the above described embodiment and the conventional ferroelectric film forming method.
Figure 3A:
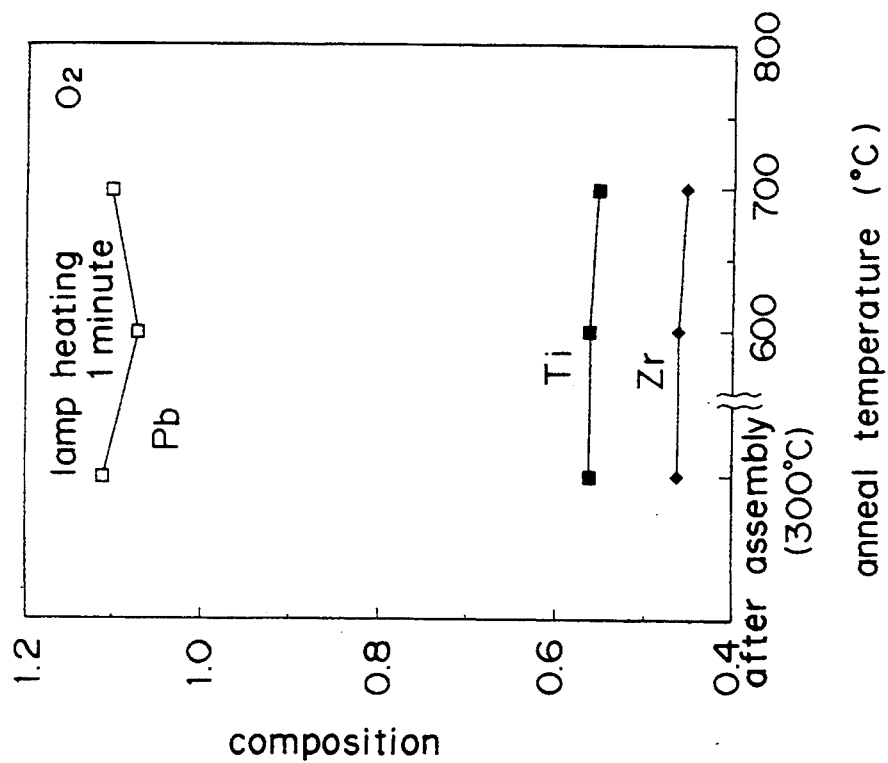

Initially, the surface of Si substrate is oxidized in an oxygen atmosphere in a diffusion furnace to form a $SiO_2$ film having a thickness of 2000 Å. To improve the contactability of platinum, platinum is piled upon the substrate at a thickness of 1000 Å by a DC magnetton sputtering process with a target of platinum. Upon overheating the substrate of the base plate up to about 300° C., a lower electrode is formed as shown in FIG. 3 (a). Thereafter, the base plate is heated at the temperature of 550° C., and RF sputtering is conducted using the plasma ion ratio ($Ar:O_2=8:2$) with a sintered material of PZT satisfied with a ratio of ($PbZrO_3$: $PbTiO_3=1:1$) being adapted as a target to pile up the PZT film in the thickness of about 5000 Å as shown in FIG. 3 (b). Since the film obtained immediately after piling up becomes amorphous or pyrochlore, it is necessary to change the crystal to a kind of perovskite construction by conducting a further heat treatment. An apparatus for conducting a heat treatment is an electric furnace of a pressurized type having an electric heater and a hermetic quartz reaction tube. The apparatus maintains several atmospheres pressure within the reaction chamber under flowing oxygen. Using this electric furnace, the piled-up PZT film is heat treated for 30 minutes at a temperature of 650° C. in oxygen of 2 to 3 atmospheres pressure. As the interior of the reaction chamber is pressurized, the vapor pressure of lead is suppressed not to eliminate most of the lead so that the crystal can be changed to a kind of perovskite construction. After the heat treatment, DC sputtering is conducted in the same method as the above with platinum being targeted to form the upper electrode so that the capacitor of ferroelectric substance is completed as shown in FIG. 3 (c).

Embodiment 6

Another ferroelectric film forming method of the present invention will be described fully hereinafter with reference to the previous embodiment 2.

A PZT ($PbZr_xTi_{1-x}O_3$) film or PLZT (($Pb_{1-x}La_x$)($Zr_yTi_{1-y}$)$_{1-x}/4O_3$) film is formed as a ferroelectric film forming method of the present invention.

(1) First, films having the above described composition are accumulated on a base plate by a sputtering method or a sol gel method. The composition of the accumulated film is assumed to be in a stoichiometrical composition ratio.

(2) Then, as shown in FIG. 2 (a), the accumulated films (represented by reference numeral 1) are irradiated by a halogen lamp for conducting a one minute thermal processing operation at 550° through 650° C. Only films accumulated on the base plate are heated so as to change the perovskite type crystal structure for forming the ferroelectric film 1'. When the heating operation is thusly quickly effected, many crystal nuclei 2 are formed, as compared with the conventional number in the film 1 as shown in FIG. 2 (a), and the crystal grain is grown with the nucleus as a seed. As a result, the grains collide with one another so as to stop the growth in a small condition where the grain diameter is small. Accordingly, the ferroelectric film 1' can be formed in a condition having the crystal grains 3 of the proper size. Also, as the thermal processing can effected for a short time, the Pb quantity in the films 1, 1' can be retained almost constant after the accumulation and after the thermal processing. The composition of the film 1 to be accumulated as described in the step (1) will finish with the stoichiometrical composition ratio. The film quality can be improved with the number of pin holes being reduced.

As is clear from the foregoing description, according to the ferroelectric film forming method of the present invention, the ferroelectric film can be formed in a condition having crystal grains of a proper size with many crystal nuclei being formed by a quick heating operation. In particular, the thermal heating of the films accumulated on the base plate is effected with lamp heating. As the thermal processing operation can be effected for a short time, the Pb quantity in the film can be kept almost constant before and after the thermal processing operation. Accordingly, the excessive PbO components are not required to be added in advance, and the film quality can be improved by reducing the number of pin holes.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A method of forming a ferroelectric film in a semiconductor device, the method comprising:

forming a lower electrode on a semiconductor substrate;

depositing a ferroelectric substance film on the lower electrode, the ferroelectric substance film including lead and having a crystalline construction;

forming a cap layer on an entire surface of the ferroelectric substance film, the cap layer being selected from a group consisting of platinum, a conductive oxide, and a silicon oxide film;

conducting a thermal heat treatment to convert the crystalline construction of the ferroelectric substance film to a perovskite construction; and wherein during the thermal heat treatment the cap layer tends to prevent lead from being evaporated from the ferroelectric substance film.

2. The method of claim 1, wherein the thermal heat treatment is effected by a lamp heating operation.

3. The method of claim 1, wherein the thermal heat treatment is conducted under high pressure.

4. The method of claim 1, wherein the cap layer comprises platinum having an orientation of (1,1,1).

5. The method of claim 1, wherein the cap layer has a thickness of at least 200 Angstroms.

6. The method of claim 1, wherein oxide conductors comprising the cap layer are selected from a group consisting of ITO, $RuO_2$, $SnO_2$, $ReO_3$, $LaCoO_3$, $La_{1-x}Sr_xCoO_3$, and $LaCaMnO_3$.

7. A method of forming a ferroelectric film in a semiconductor device, the method comprising:

depositing a ferroelectric substance film on a substrate, the ferroelectric substance film including Pb and having a crystalline construction;

conducting a thermal heat treatment of the ferroelectric substance film in an atmosphere having Pb or PbO gas to change the ferroelectric substance film into a perovskite crystalline construction; and wherein the presence of Pb or PbO gas in the atmosphere tends to prevent Pb from being evaporated from the ferroelectric substance film during the thermal heat treatment.

8. The method of claim 7, wherein the thermal heat treatment is conducted under high pressure.

9. A method for forming a ferroelectric film having a perovskite crystalline structure, the method comprising:

accumulating on a base pate a ferroelectric film which includes Pb;

conducting a thermal heat treatment whereby the ferroelectric film is changed to have a perovskite type crystal structure, the thermal heat treatment being conducted in an oxygen atomic atmosphere, the oxygen atomic atmosphere being formed by irradiating ozone with ultraviolet rays.

10. The method of claim 9, wherein the oxygen atomic atmosphere has a pressure of from 10 to 50 Torr.

11. The method of claim 9, wherein the thermal heat treatment is conducted at 650 degrees Centigrade.

12. The method of claim 9, wherein the ultraviolet rays have a wavelength not greater than 185 nm.

13. A method for forming a ferroelectric film having a perovskite crystalline structure, the method comprising:

accumulating on a base plate a ferroelectric film which includes Pb;

conducting a thermal heat treatment whereby the ferroelectric film is changed to have a perovskite type crystal structure, the thermal heat treatment being conducted in an oxygen atomic atmosphere, the oxygen atomic atmosphere being formed by irradiating ozone with ultraviolet rays having a wavelength not greater than 185 nm in order to form many crystal nuclei and to confine growth of crystal grain to a small diameter.

14. The method of claim 13, wherein ozone ($O_3$) is decomposed into $O_{(1D)}$ and oxygen $O_2$, and whereby oxidation is promoted with the $O_{(1D)}$ to prevent oxygen deficit defects in the film.

15. The method of claim 13, wherein the oxygen atomic atmosphere is formed by irradiating ozone with ultraviolet rays having a wavelength not greater than 185 nm for one minute.

* * * * *